United States Patent
Usui (10) Patent No.: US 10,951,128 B2
(45) Date of Patent: Mar. 16, 2021

(54) MAIN CIRCUIT WIRING MEMBER AND POWER CONVERSION DEVICE

(71) Applicant: Mitsubishi Electric Corporation, Tokyo (JP)

(72) Inventor: Yuhei Usui, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/638,208

(22) PCT Filed: Aug. 30, 2017

(86) PCT No.: PCT/JP2017/031236
§ 371 (c)(1),
(2) Date: Feb. 11, 2020

(87) PCT Pub. No.: WO2019/043849
PCT Pub. Date: Mar. 7, 2019

(65) Prior Publication Data
US 2020/0366216 A1 Nov. 19, 2020

(51) Int. Cl.
*H02M 7/00* (2006.01)
*H02M 7/487* (2007.01)
(Continued)

(52) U.S. Cl.
CPC .......... *H02M 7/003* (2013.01); *H02M 7/487* (2013.01); *H05K 1/115* (2013.01); *H05K 1/181* (2013.01);
(Continued)

(58) Field of Classification Search
CPC ...... H02M 7/003; H02M 7/487; H05K 1/115; H05K 1/181; H05K 2201/10015
(Continued)

(56) References Cited

U.S. PATENT DOCUMENTS 5,763,946 A * 6/1998 Nakadaira ......... H01L 23/49861
257/693
6,870,253 B1 * 3/2005 Ushijima ............. H01L 25/115
257/691

(Continued)

FOREIGN PATENT DOCUMENTS

JP 2012005300 A 1/2012

OTHER PUBLICATIONS

International Search Report (PCT/ISA/210), with translation, and Written Opinion (PCT/ISA/237) dated Nov. 21, 2017, by the Japan Patent Office as the International Searching Authority for International Application No. PCT/JP2017/031236.

*Primary Examiner* — Sherman Ng
(74) *Attorney, Agent, or Firm* — Buchanan Ingersoll & Rooney PC (57) ABSTRACT

A busbar includes an opening, a first terminal, and a second terminal. The first terminal includes a first terminal piece with a step-like bent shape, in which the first terminal piece is bent from a conductor along a bending line, and a plurality of hole portions formed on the first terminal piece and arrayed in a direction parallel to the bending line. The second terminal includes a second terminal piece with a step-like bent shape, in which the second terminal piece is bent from a conductor along a bending line, and a plurality of hole portions formed on the second terminal piece and arrayed in a direction parallel to the bending line. The busbar balances the current sharing in a current that flows through a plurality of fastening points.

10 Claims, 9 Drawing Sheets

(51) Int. Cl.
*H05K 1/11* (2006.01)
*H05K 1/18* (2006.01)
*H02P 27/06* (2006.01)

(52) U.S. Cl.
CPC .... *H02P 27/06* (2013.01); *H05K 2201/10015* (2013.01)

(58) Field of Classification Search
USPC ........................................................ 174/68.2
See application file for complete search history.

(56) References Cited

U.S. PATENT DOCUMENTS

| | | | | |
|---|---|---|---|---|
| 2009/0085188 | A1* | 4/2009 | Yamada | H05K 3/325 |
| | | | | 257/690 |
| 2010/0173509 | A1* | 7/2010 | Holbrook | H05K 7/1432 |
| | | | | 439/208 |
| 2011/0221268 | A1* | 9/2011 | Kanazawa | H05K 1/0263 |
| | | | | 307/10.1 |
| 2011/0272797 | A1* | 11/2011 | Onishi | H01L 23/36 |
| | | | | 257/698 |
| 2011/0308834 | A1 | 12/2011 | Takahashi | |
| 2015/0035496 | A1* | 2/2015 | Kikuchi | B60L 50/10 |
| | | | | 320/137 |
| 2016/0049629 | A1* | 2/2016 | Matsuda | H01M 2/206 |
| | | | | 429/121 |
| 2016/0190915 | A1* | 6/2016 | Horiuchi | H01L 25/072 |
| | | | | 363/132 |
| 2018/0206359 | A1* | 7/2018 | McPherson | H02M 3/158 |

* cited by examiner

MAIN CIRCUIT WIRING MEMBER AND POWER CONVERSION DEVICE

FIELD

The present invention relates to a main circuit wiring member on which a semiconductor module is mounted, and also relates to a power conversion device.

BACKGROUND

In a power conversion device, a busbar is used as a main circuit wiring member that connects to a semiconductor module. A laminate busbar, which is one of the types of busbar, is formed by layering a plurality of conductors through insulators to form a multilayered busbar and covering the surface of the multilayered busbar with a laminate material.

Patent Literature 1 discloses a laminate busbar in which a concave terminal lead-out window is formed at an end portion of the laminate busbar, and a plurality of connection terminal portions are led out to the terminal lead-out window in accordance with the array of main circuit terminals of an IGBT (Insulated Gate Bipolar Transistor) module. Each of the connection terminal portions is formed with a through hole for screw-fastening to each of the main circuit terminals of the IGBT module.

CITATION LIST

Patent Literature

Patent Literature 1: Japanese Patent Application Laid-open No. 2012-5300

SUMMARY

Technical Problem

In Patent Literature 1, only a single fastening point is provided for a terminal electrode at the same potential level. However, in a power semiconductor module for high current applications, a plurality of fastening points for connecting to the laminate busbar are provided for a terminal electrode at the same potential level. In a case where a terminal electrode is connected to a laminate busbar at a plurality of fastening points, when a different amount of current flows through each of the fastening points, heat generation becomes concentrated locally at a fastening point where a greater amount of current flows.

The present invention has been achieved to solve the above problems, and an object of the present invention is to provide a main circuit wiring member and a power conversion device that can balance the current sharing in a current that flows through a plurality of fastening points.

Solution to Problem

In order to solve the above problems and achieve the object, in the present invention, a main circuit wiring member includes a first main surface on which a first semiconductor module is mounted, a second main surface that is a surface opposite to the first main surface, and a plurality of flat conductors layered through insulators, and the main circuit wiring member includes: a first flat conductor located on a first layer and applied with a first potential; a second flat conductor located on a second layer and applied with a second potential; a first opening passing through between the first main surface and the second main surface; a first terminal; and a second terminal. The first terminal includes a first terminal piece with a step-like bent shape, in which the first terminal piece is bent from the first flat conductor along a first side that is one of sides of the first opening, and a plurality of first hole portions formed on the first terminal piece and arrayed in a direction parallel to the first side. The second terminal includes a second terminal piece with a step-like bent shape, in which the second terminal piece is bent from the second flat conductor along a second side that is one of sides of the first opening and opposed to the first side, and a plurality of second hole portions formed on the second terminal piece and arrayed in a direction parallel to the second side. The first terminal is fastened to a first module terminal of the first semiconductor module through the first hole portions, and the second terminal is fastened to a second module terminal of the first semiconductor module through the second hole portions.

Advantageous Effects of Invention

According to the present invention, there is an effect where it is possible to balance the current sharing in a current that flows through a plurality of fastening points.

DESCRIPTION OF EMBODIMENTS

A main circuit wiring member and a power conversion device according to an embodiment of the present invention will be described in detail below with reference to the accompanying drawings. The present invention is not limited to the embodiment.

Embodiment

Figure 1:
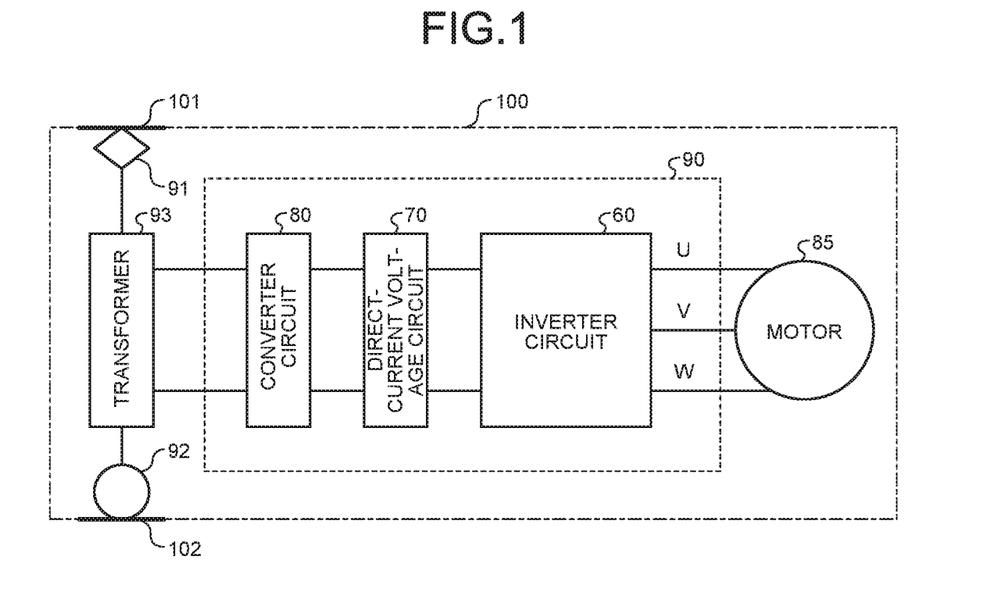
FIG. 1 is a diagram illustrating a configuration example of a power conversion device mounted on a railway vehicle.

FIG. 1 is a diagram illustrating an example of a functional configuration of a power conversion device according to an embodiment of the present invention, and illustrates a configuration example of a power conversion device 90 mounted on a railway vehicle 100. As illustrated in FIG. 1, the railway vehicle 100 includes a current collector 91 connected to an overhead wire 101, a wheel 92 connected to a rail 102, a transformer 93 located on the input side of the power conversion device 90 and connected to a converter circuit 80, the power conversion device 90 including the converter circuit 80, a direct-current voltage circuit 70, and an inverter circuit 60, and a motor 85 that is supplied with power from the power conversion device 90 and drives the railway vehicle 100. It is preferable that the motor 85 is an induction motor or a synchronous motor.

One end of a primary winding of the transformer 93 is connected to the overhead wire 101 through the current collector 91, while the other end of the primary winding is connected through the wheel 92 to the rail 102 that is at an earth potential. Power supplied from the overhead wire 101 is input to the primary winding of the transformer 93 through the current collector 91, while power generated on a secondary winding of the transformer 93 is input to the converter circuit 80.

The converter circuit 80 is constituted of a bridge circuit including two sets of legs for a U-phase and a V-phase. The converter circuit 80 includes a plurality of switching elements. When PWM control is executed on the switching elements, the converter circuit 80 converts an input alternating-current voltage to a direct-current voltage and outputs the direct-current voltage to the direct-current voltage circuit 70.

The direct-current voltage circuit 70 includes one or a plurality of capacitors to store therein direct-current power input from the converter circuit 80.

The inverter circuit 60 converts the direct-current voltage of the direct-current voltage circuit 70 to a three-phase alternating-current voltage including a U-phase, a V-phase, and a W-phase and having a certain frequency, and outputs the converted three-phase alternating-current voltage to the motor 85. Specific examples of the direct-current voltage circuit 70 and the inverter circuit 60 are described later.

Figure 2:
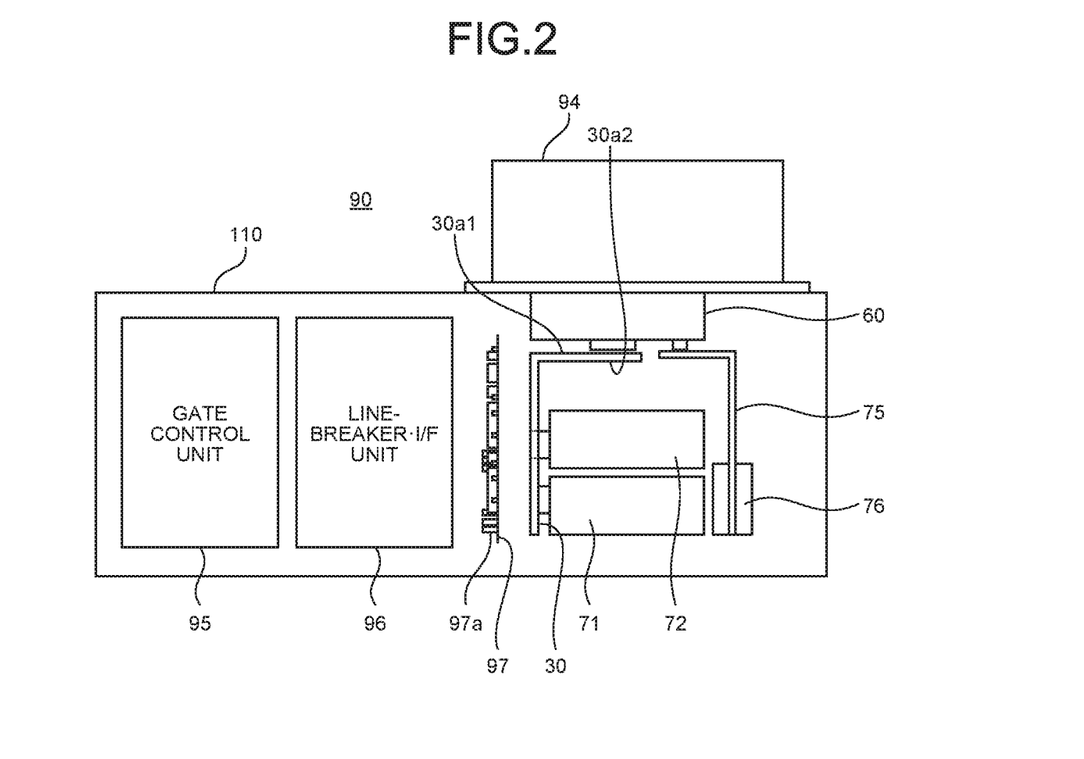
FIG. 2 is view illustrating a part of the power conversion device.

FIG. 2 is a plan view illustrating a configuration example of the power conversion device 90 illustrated in FIG. 1 as viewed partially from the upper side of the railway vehicle 100 toward the rail 102. As illustrated in FIG. 2, the power conversion device 90 includes a radiator 94, a gate control unit 95, a line-breaker-interface unit 96, capacitors 71 and 72 constituting the direct-current voltage circuit 70, a gate drive-circuit substrate 97, the inverter circuit 60, a laminate busbar 30 that serves as a main circuit wiring member (hereinafter, sometimes abbreviated as "busbar"), a conductor bar 75, and an output core 76. The radiator 94 is attached to the outside of a casing 110. Constituent elements other than the radiator 94 are accommodated within the casing 110.

The inverter circuit 60 includes a plurality of semiconductor modules, and converts direct-current power stored in the capacitors 71 and 72 into three-phase alternating-current power. The gate drive-circuit substrate 97 has a gate drive circuit 97a mounted thereon, in which the gate drive circuit 97a generates a drive signal necessary for performing PWM (Pulse Width Modulation) driving of the semiconductor modules included in the inverter circuit 60. The gate control unit 95 controls the gate drive circuit 97a. The line-breaker I/F unit 96 has a function of interrupting a current that flows through the inverter circuit 60, and a function of receiving and transmitting a signal between the gate control unit 95 and the gate drive circuit 97a.

The capacitors 71 and 72 are electrically and mechanically coupled with the semiconductor modules included in the inverter circuit 60 by the laminate busbar 30 formed into an L-shape. In the laminate busbar 30, a plurality of layers of flat conductors and a plurality of layers of insulators are covered with a laminate material. Instead of the laminate busbar 30, it is permissible to use a multilayered busbar that is not covered with a laminate material. The conductor bar 75 connects the inverter circuit 60 and the motor 85. The output core 76 is a terminal portion for connecting the motor 85 and the inverter circuit 60.

Figure 3:
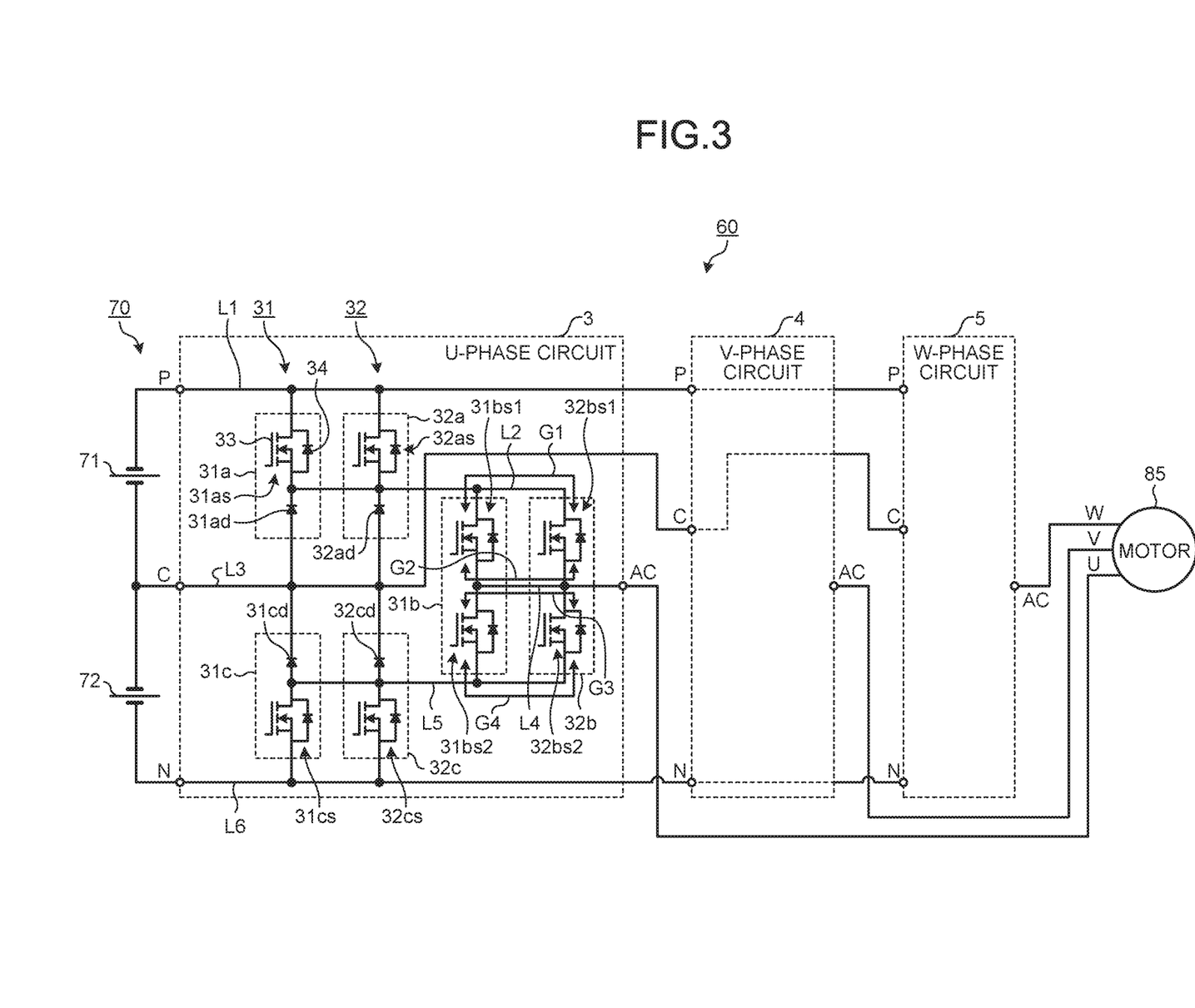
FIG. 3 is a circuit diagram illustrating an example of a specific configuration of an inverter circuit.

FIG. 3 is a circuit diagram illustrating an example of a specific configuration of the inverter circuit 60. FIG. 3 illustrates a three-level power conversion device that operates at three voltage levels. The direct-current voltage circuit 70 includes the capacitors 71 and 72 connected in series. Three potential terminals, including an upper-side direct-current terminal P, a lower-side direct-current terminal N, and an intermediate potential terminal C, are formed by respective one ends of the capacitors 71 and 72, and a connection point of the capacitors 71 and 72. In the following descriptions, the upper-side direct-current terminal P, the lower-side direct-current terminal N, and the intermediate potential terminal C are abbreviated as "P terminal", "N terminal", and "C terminal", respectively. In FIG. 3, the direct-current voltage circuit 70 and the inverter circuit 60 operate as a three-level power conversion device. It is also permissible to employ a two-level power conversion device that operates at two voltage levels as the inverter circuit 60. The inverter circuit 60 includes a U-phase circuit 3 that outputs a U-phase drive signal for driving the motor 85, a V-phase circuit 4 that outputs a V-phase drive signal for driving the motor 85, and a W-phase circuit 5 that outputs a W-phase drive signal for driving the motor 85.

The U-phase circuit 3 includes a U-phase first leg 31 and a U-phase second leg 32 that are connected in parallel. The U-phase first leg 31 includes a U-phase upper module 31a, a U-phase intermediate module 31b, and a U-phase lower module 31c. For example, the U-phase upper module is an abbreviation of the U-phase upper semiconductor module. The U-phase second leg 32 includes a U-phase upper module 32a, a U-phase intermediate module 32b, and a U-phase lower module 32c. It is permissible that the U-phase circuit 3 is constituted of only the U-phase first leg 31, or is constituted of three or more legs. The same applies also to the V-phase circuit 4 and the W-phase circuit 5.

The U-phase upper module 31a includes a switching element 31as and a clamp diode 31ad that are connected in series. The U-phase intermediate module 31b includes a switching element 31bs1 and a switching element 31bs2 that are connected in series. The U-phase lower module 31c includes a clamp diode 31cd and a switching element 31cs that are connected in series. The U-phase upper module 32a includes a switching element 32as and a clamp diode 32ad that are connected in series. The U-phase intermediate module 32b includes a switching element 32bs1 and a switching element 32bs2 that are connected in series. The U-phase lower module 32c includes a clamp diode 32cd and a switching element 32cs that are connected in series. The clamp diodes 31*ad* and 32*ad* function as a neutral-point clamp diode on the higher-potential side. The clamp diodes 31*cd* and 32*cd* function as a neutral-point clamp diode on the lower-potential side.

One end of the switching element 31*as* and one end of the switching element 32*as* are connected to the P terminal through a wire L1. A connection point of the switching element 31*as* and the clamp diode 31*ad*, a connection point of the switching element 32*as* and the clamp diode 32*ad*, one end of the switching element 31*bs*1, and one end of the switching element 32*bs*1 are connected by a wire L2. A connection point of the clamp diode 31*ad* and the clamp diode 31*cd*, and a connection point of the clamp diode 32*ad* and the clamp diode 32*cd* are connected to the C terminal through a wire L3. A connection point of the switching element 31*bs*1 and the switching element 31*bs*2, and a connection point of the switching element 32*bs*1 and the switching element 32*bs*2 are connected to an alternating-current output terminal AC through a wire L4. The alternating-current output terminal AC is connected to a U-phase drive terminal of the motor 85. A connection point of the switching element 31*cs* and the clamp diode 31*cd*, a connection point of the switching element 32*cs* and the clamp diode 32*cd*, one end of the switching element 31*bs*2, and one end of the switching element 32*bs*2 are connected by a wire L5. One end of the switching element 31*cs* and one end of the switching element 32*cs* are connected to the N terminal through a wire L6.

Each of the switching elements 31*as*, 31*bs*1, 31*bs*2, 31*cs*, 32*as*, 32*bs*1, 32*bs*2, and 32*cs* is constituted of, for example, an SiC-based SiC-MOSFET 33 and an SiC-based SiC-FWD (Fly Wheel Diode) 34. The SiC-MOSFET 33 and the SiC-FWD 34 are connected in inverse parallel. As each of the switching elements, it is permissible to use an IGBT (Insulated Gate Bipolar Transistor) in which diodes connected in inverse parallel are incorporated. For example, each of the clamp diodes 31*ad*, 31*cd*, 32*ad*, and 32*cd* is an SiC-based diode (SiC-D).

The V-phase circuit 4 and the W-phase circuit 5 are configured identically to the U-phase circuit 3. In this manner, the inverter circuit 60 constitutes a three-phase inverter circuit in which the first leg and the second leg for each phase are connected in parallel. While FIG. 3 merely illustrates an example of the circuit configuration, it is possible to appropriately change the circuit configuration.

The inverter circuit 60 illustrated in FIG. 3 is implemented by using six semiconductor modules, each of which has an identical circuit configuration to the U-phase upper module 31*a*, by using six semiconductor modules, each of which has an identical circuit configuration to the U-phase intermediate module 31*b*, by using six semiconductor modules, each of which has an identical circuit configuration to the U-phase lower module 31*c*, and by performing the wire connection illustrated in FIG. 3 using the laminate busbar 30. Three types of semiconductor modules are respectively accommodated in packages with an identical shape, identical dimensions, and identical terminal positions.

Figure 4:
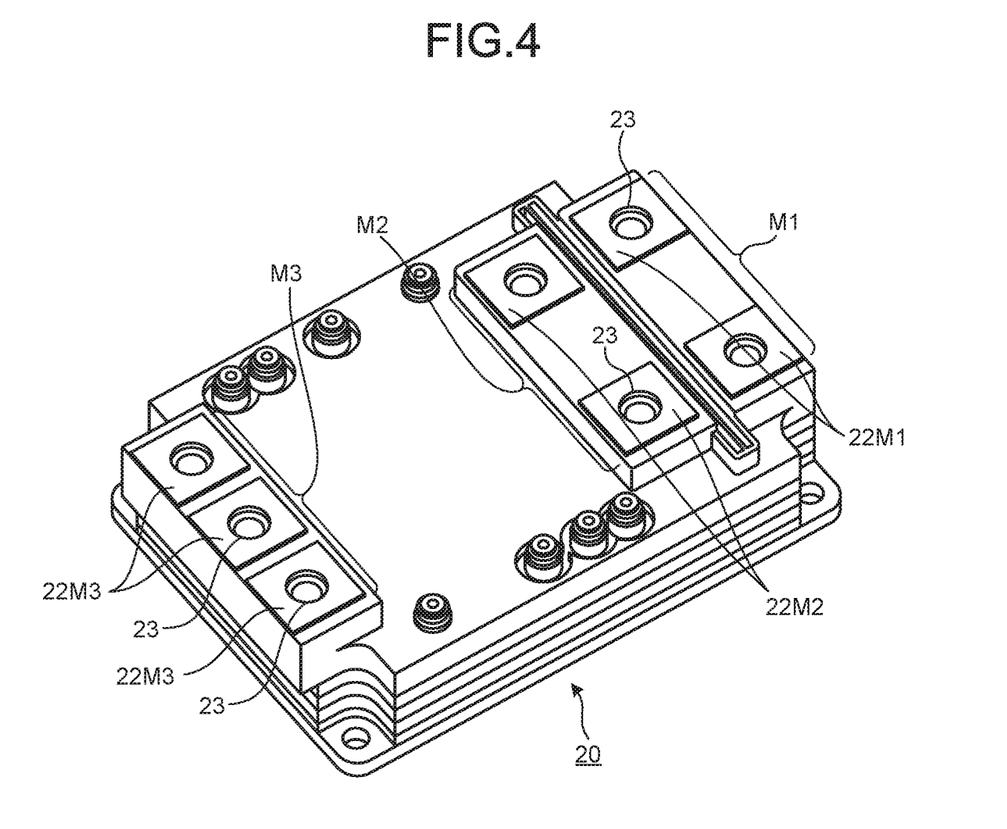
FIG. 4 is a perspective view illustrating an external appearance of a package in which each of semiconductor modules is accommodated.

FIG. 4 is a perspective view illustrating an external appearance of a package 20 in which each of the three types of semiconductor modules is accommodated. The package 20 is formed into a cuboid shape that is elongated in the transverse direction. A first input terminal M1 that is a first module terminal, a second input terminal M2 that is a second module terminal, and an output terminal M3 that is a third module terminal are provided on one of the main surfaces of the package 20. The first input terminal M1 is provided with two fastening points 22M1. The second input terminal M2 is provided with two fastening points 22M2. The output terminal M3 is provided with three fastening points 22M3. Each of the fastening points 22M1, 22M2, and 22M3 is formed with a hole 23 through which a conductive fastening member such as a bolt, a screw, or a pin is inserted. Because each of the first input terminal M1, the second input terminal M2, and the output terminal M3 includes a plurality of fastening points, the current sharing balance between chips within the semiconductor module is improved, and accordingly an imbalance in heat generation within the semiconductor module can be reduced.

In FIG. 4, while the number of fastening points of the first input terminal M1 is two, the number of fastening points of the second input terminal M2 is two, and the number of fastening points of the output terminal M3 is three, it is permissible to change these numbers of fastening points in accordance with the current capacitance. That is, it is permissible that each of the number of fastening points of the first input terminal M1 and the number of fastening points of the second input terminal M2 is three or more. Further, it is permissible that the number of fastening points of the output terminal M3 is two, or is four or more.

The two fastening points 22M1 of the first input terminal M1 are located on one of the shorter-side portions of the package 20. The two fastening points 22M1 are arrayed along the shorter-side direction of the package 20. The two fastening points 22M2 of the second input terminal M2 are arrayed in parallel to the array of the two fastening points 22M1 of the first input terminal M1, and closer to the central portion of the package 20 relative to the first input terminal M1. The three fastening points 22M3 of the output terminal M3 are located on the other shorter-side portion of the package 20. The three fastening points 22M3 are arrayed along the shorter-side direction of the package 20. The fastening points of the first input terminal M1, the second input terminal M2, and the output terminal M3 are located at line-symmetric positions with respect to the center line extending parallel to the longitudinal direction of the package 20.

Figure 5:
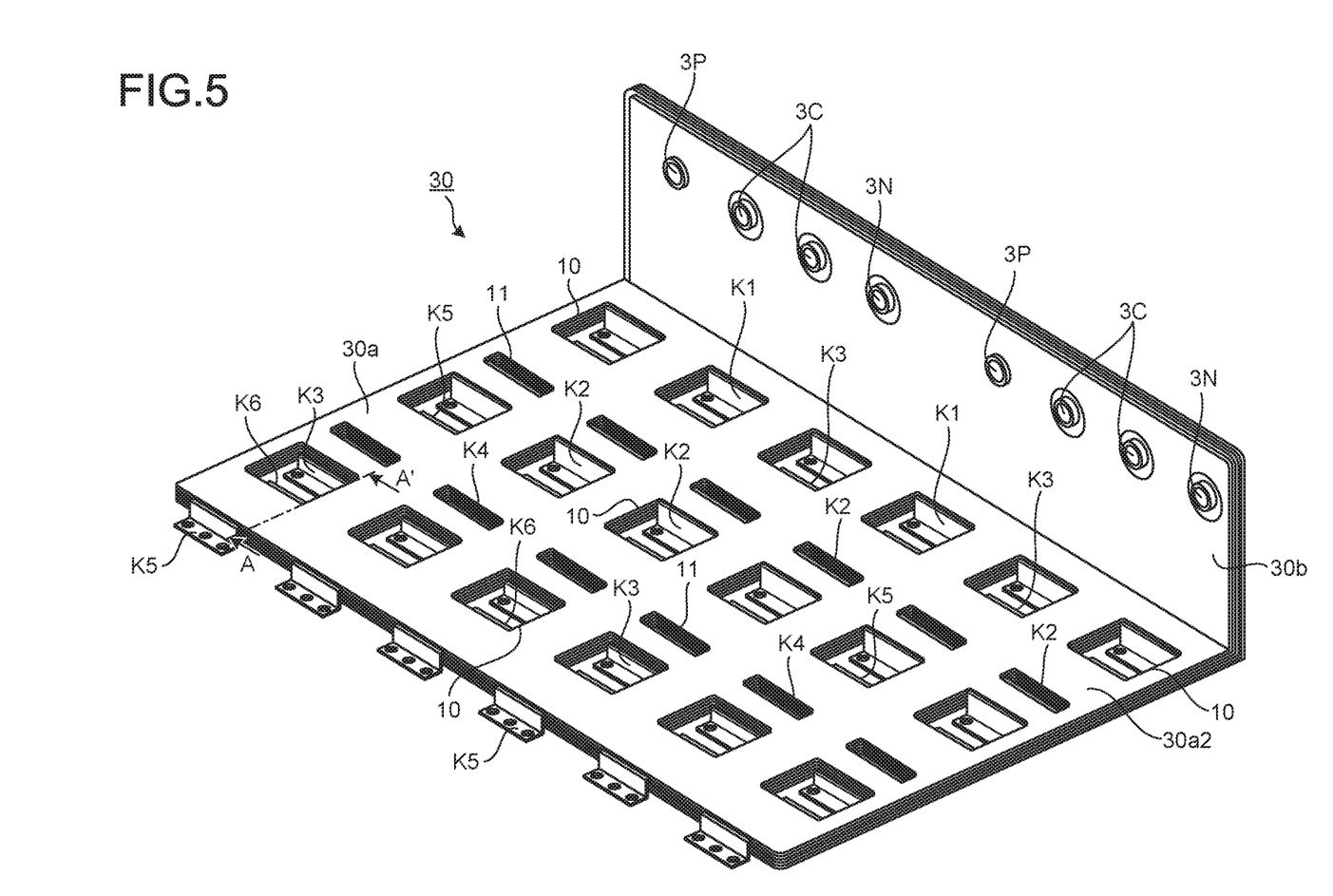
FIG. 5 is a perspective view illustrating an external appearance of a laminate busbar according to an embodiment of the present invention.
Figure 6:
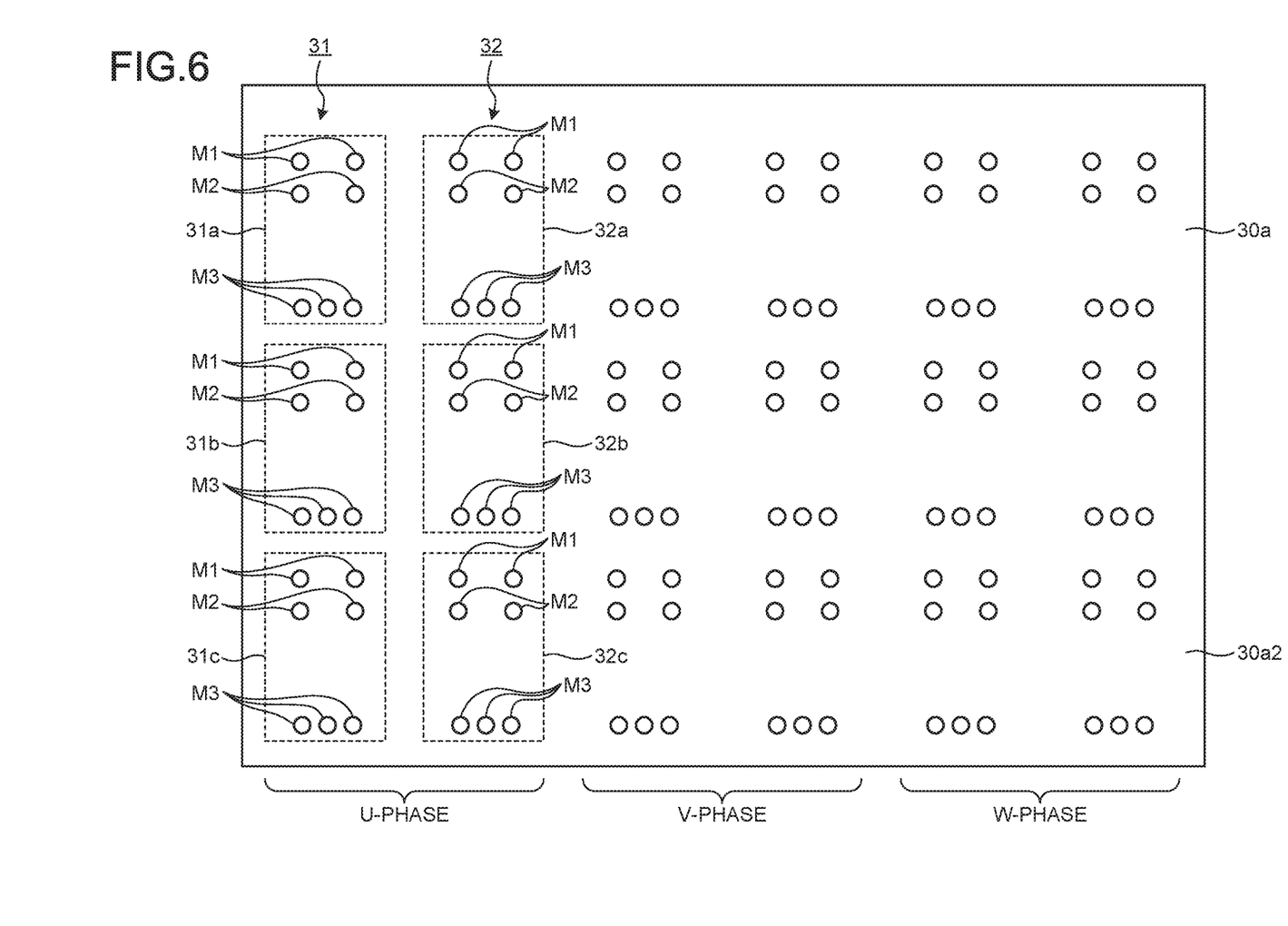
FIG. 6 is a plan view illustrating a location example of a plurality of semiconductor modules on the laminate busbar according to the embodiment.
Figure 7:
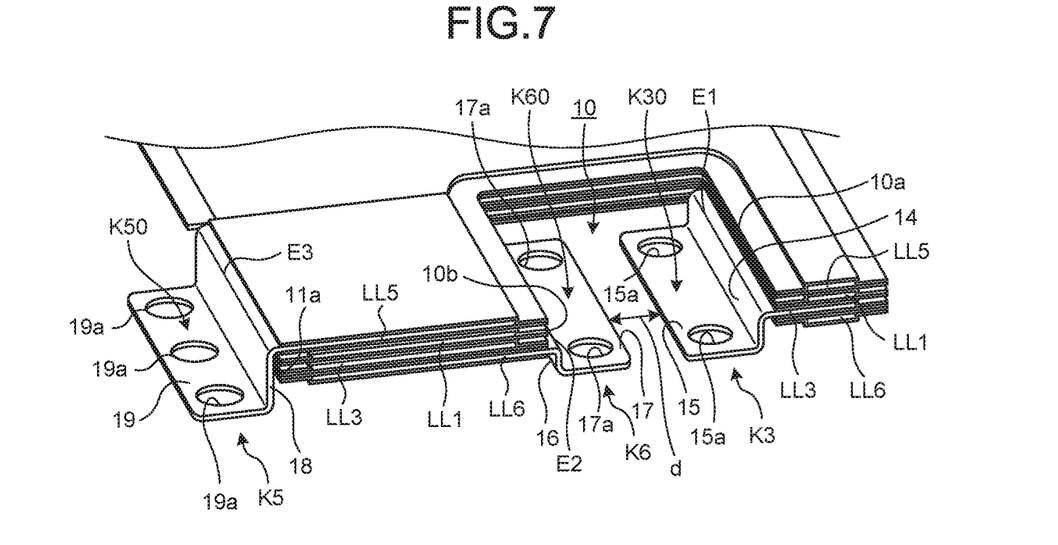
FIG. 7 is a cross-sectional diagram taken along a line A-A' in FIG. 5.
Figure 8:
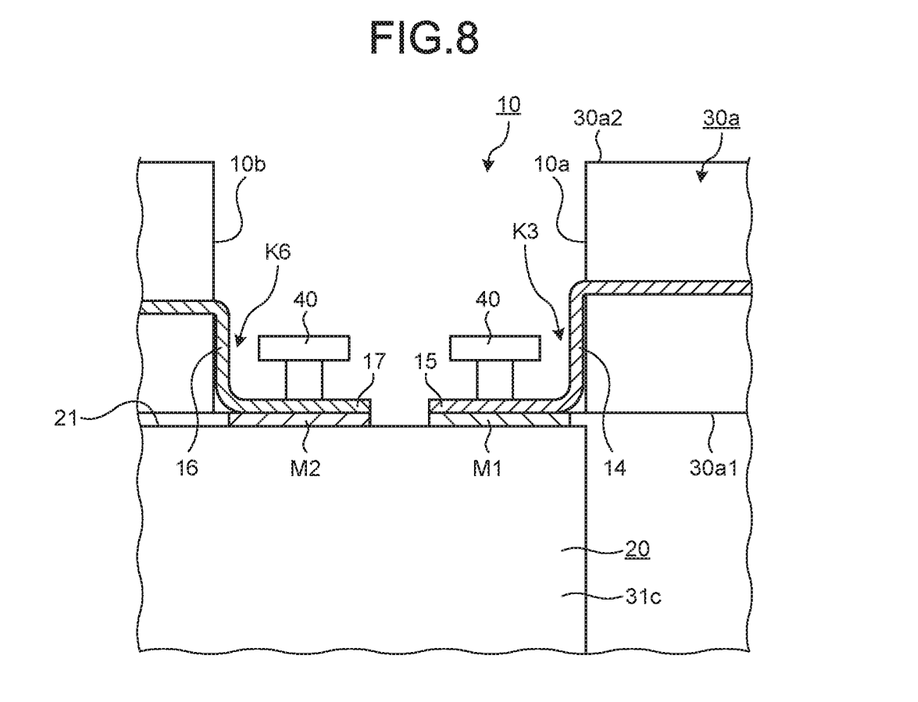
FIG. 8 is a diagram illustrating a coupling state of the semiconductor module and the laminate busbar according to the embodiment.

FIG. 5 is a perspective view illustrating a configuration example of an external appearance of the laminate busbar 30 according to the present embodiment. FIG. 6 is a conceptual plan view illustrating a location example of 18 semiconductor modules on the busbar 30. FIG. 7 is a cross-sectional diagram taken along a line A-A' in FIG. 5. FIG. 8 is a diagram illustrating a coupling state of the busbar 30 and the semiconductor module.

As illustrated in FIG. 5, the laminate busbar 30 has an L-shape. That is, the laminate busbar 30 includes a first busbar 30*a* on which 18 semiconductor modules are mounted in a three-rows by six-columns matrix, and a second busbar 30*b* on which the capacitors 71 and 72 are mounted. The second busbar 30*b* includes two P terminals 3P, two N terminals 3N, and four C terminals 3C. The first busbar 30*a* includes a first main surface 30*a*1 on which 18 semiconductor modules are mounted (see FIG. 2 and FIG. 8), and a second main surface 30*a*2 that is a surface opposite to the first main surface 30*a*1 and that does not have a semiconductor module mounted thereon. FIG. 5 illustrates the second main surface 30*a*2 of the first busbar 30*a*.

With reference to FIG. 6, the location of 18 semiconductor modules on the first busbar 30*a* of the busbar 30 is described below. FIG. 6 illustrates the location of the semiconductor modules as viewed from the side of the second main surface 30*a*2 of the first busbar 30*a*. Three semiconductor modules 31*a*, 31*b*, and 31*c* constituting the U-phase first leg 31 are mounted on a first column portion positioned on one-end side of the first busbar 30a. Three semiconductor modules 32a, 32b, and 32c constituting the U-phase second leg 32 are mounted on a second column portion adjacent to the first column portion. Three semiconductor modules constituting the first leg of the V-phase circuit 4 are mounted on a third column portion positioned at the central portion of the first busbar 30a. Three semiconductor modules constituting the second leg of the V-phase circuit 4 are mounted on a fourth column portion adjacent to the third column portion. Three semiconductor modules constituting the first leg of the W-phase circuit 5 are mounted on a fifth column portion adjacent to the fourth column portion. Three semiconductor modules constituting the second leg of the W-phase circuit 5 are mounted on a sixth column portion positioned on the other-end side of the first busbar 30a.

Next, descriptions are given of a correspondence relation between six wires L1 to L6 in the inverter circuit 60 illustrated in FIG. 3, and the first input terminal M1, the second input terminal M2, and the output terminal M3 of six semiconductor modules 31a, 31b, 31c, 32a, 32b, and 32c included in the U-phase circuit 3.

The first input terminal M1 of the U-phase upper modules 31a and 32a is connected to the wire L1 connected to the P terminal 3P. The second input terminal M2 of the U-phase upper modules 31a and 32a is connected to the wire L3 connected to the C terminal 3C. The output terminal M3 of the U-phase upper modules 31a and 32a is connected to the wire L2.

The first input terminal M1 of the U-phase intermediate modules 31b and 32b is connected to the wire L2. The second input terminal M2 of the U-phase intermediate modules 31b and 32b is connected to the wire L5. The output terminal M3 of the U-phase intermediate modules 31b and 32b is connected to the wire L4 connected to the alternating-current output terminal AC. The first input terminal M1 of the U-phase lower modules 31c and 32c is connected to the wire L3 connected to the C terminal 3C. The second input terminal M2 of the U-phase lower modules 31c and 32c is connected to the wire L6 connected to the N terminal 3N. The output terminal M3 of the U-phase lower modules 31c and 32c is connected to the wire L5. The connection configuration in the V-phase circuit 4 and the W-phase circuit 5 is identical to that of the U-phase circuit 3.

The second busbar 30b includes a flat conductor LL1 connected to the P terminal 3P and constituting the wire L1, a flat conductor LL6 connected to the N terminal 3N and constituting the wire L6, and a flat conductor LL3 connected to the C terminal 3C and constituting the wire L3. The first busbar 30a includes the flat conductor LL1, a flat conductor LL2 constituting the wire L2, the flat conductor LL3, a flat conductor LL4 connected to the alternating-current output terminal AC and constituting the wire L4, a flat conductor LL5 constituting the wire L5, and the flat conductor LL6. Some of the flat conductors LL1 to LL6, that is, the flat conductors LL1, LL3, LL5, and LL6 are illustrated in FIG. 7. The flat conductors LL1 to LL6 are also abbreviated as "conductors LL1 to LL6".

Each of the conductors LL1 to LL6 is located on any of the conductor layers of the first busbar 30a. While FIG. 7 illustrates the layer location of the conductors LL1, LL3, LL5, and LL6, the layer location is not limited thereto.

As illustrated in FIG. 5, the first busbar 30a includes a plurality of conductor terminals K1 extending from the conductor LL1, a plurality of conductor terminals K2 extending from the conductor LL2, a plurality of conductor terminals K3 extending from the conductor LL3, a plurality of conductor terminals K4 extending from the conductor LL4, a plurality of conductor terminals K5 extending from the conductor LL5, and a plurality of conductor terminals K6 extending from the conductor LL6.

As illustrated in FIG. 5, the conductor terminals K1 are arrayed on the first row as viewed from the second busbar 30b. The conductor terminals K3 are arrayed on the second column. The conductor terminals K2 are arrayed on the third column. The conductor terminals K2 are arrayed on the fourth column. The conductor terminals K5 are arrayed on the fifth column. The conductor terminals K4 are arrayed on the sixth column. The conductor terminals K3 are arrayed on the seventh column. The conductor terminals K6 are arrayed on the eighth column. The conductor terminals K5 are arrayed on the ninth column.

The first busbar 30a includes a plurality of first-type openings 10, each of which is a square-shaped or rectangular-shaped through hole, and a plurality of second-type openings 11, each of which is a rectangular-shaped through hole. The opening 10 corresponds to a first opening. The opening 11 corresponds to a second opening. The opening 10 has a greater opening area than the opening 11. A pair of conductor terminals located to be opposed to each other are exposed to the outside from the first-type opening 10. Among the conductor terminals K1 to K6, a pair of conductor terminals connected to the first input terminal M1 and the second input terminal M2 of each semiconductor module is exposed from the first-type opening 10. A single conductor terminal is exposed to the outside from the second-type opening 11. Among the conductor terminals K1 to K6, a conductor terminal connected to the output terminal M3 of each semiconductor module is exposed from the second-type opening 11. In FIG. 5, the conductor terminals K5 arrayed on the ninth column are exposed from an edge portion of the first busbar 30a. However, it is also permissible that the conductor terminals K5 arrayed on the ninth column are exposed from the second-type openings 11.

A pair of conductor terminals located in the first-type opening 10 is described below. FIG. 7 illustrates a location relation between the conductor terminal K3 and the conductor terminal K6. The conductor terminal K3 as a first terminal includes a terminal piece K30 having a step-like bent shape that is L-shaped, and extending from the conductor LL3 as a first flat conductor. The terminal piece K30 corresponds to a first terminal piece. The first flat conductor is located on a certain first layer and is applied with a first potential. The terminal piece K30 of the conductor terminal K3 includes a step portion 14 as a first step portion, and a contact portion 15 as a first contact portion. The step portion 14 is bent along a bending line E1 at substantially a right angle relative to the conductor LL3, and extends along a first edge wall 10a until reaching the first main surface 30a1 of the first busbar 30a. The bending line E1 extends along a first side that is one of the sides of the opening 10. The first edge wall 10a constitutes the first side. The contact portion 15 is bent at substantially a right angle relative to the step portion 14, and extends parallel to the first main surface 30a1 of the first busbar 30a. The contact portion 15 includes two hole portions 15a and 15a that face, and come into contact with, the two fastening points 22M1 of the first input terminal M1 of the U-phase lower module 31c. The hole portions 15a and 15a correspond to a first hole portion. The two hole portions 15a and 15a are arrayed such that the line segment connecting the two hole portions 15a and 15a extends parallel to the bending line E1 for the conductor LL3, in other words, such that the line segment extends parallel to the first side. The contact portion 15 has a rectangular plate-like shape, and has a greater length in a direction parallel to the bending line E1 than the length of the contact portion 15 in a direction perpendicular to the bending line E1.

The conductor terminal K6 as a second terminal includes a terminal piece K60 having a step-like bent shape that is L-shaped, and extending from the conductor LL6 as a second flat conductor. The terminal piece K60 corresponds to a second terminal piece. The second flat conductor is located on a second layer different from the first layer, and is applied with a second potential different from the first potential. The terminal piece K60 of the conductor terminal K6 includes a step portion 16 as a second step portion, and a contact portion 17 as a second contact portion. The step portion 16 is bent along a bending line E2 at substantially a right angle relative to the conductor LL6, and extends along a second edge wall 10b until reaching the first main surface 30a1 of the first busbar 30a. The bending line E2 extends along a second side that is opposed to the first side. The second edge wall 10b constitutes the second side. The contact portion 17 is bent at substantially a right angle relative to the step portion 16, and extends parallel to the first main surface 30a1 of the first busbar 30a. The contact portion 17 includes two hole portions 17a and 17a that face and come into contact with the two fastening points 22M2 of the second input terminal M2 of the U-phase lower module 31c. The hole portions 17a and 17a correspond to a second hole portion. The two hole portions 17a and 17a are arrayed such that the line segment connecting the two hole portions 17a and 17a extends parallel to the bending line E2 for the conductor LL6. The contact portion 17 has a rectangular plate-like shape, and has a greater length in a direction parallel to the bending line E2 than the length of the contact portion 17 in a direction perpendicular to the bending line E2.

In order to satisfy a spatial insulation distance defined by the railway international standards, a spacing d between the contact portion 15 and the contact portion 17 which are supplied with different potentials is set to a length equal to or greater than the spatial insulation distance. Because there is a spatial gap between the contact portion 15 and the contact portion 17, it is unnecessary to take into account the creepage insulation distance.

A conductor terminal located in the second-type opening 11 is explained by describing the conductor terminal K5 illustrated in FIG. 7 as an example. The conductor terminal K5 as a third terminal includes a terminal piece K50 having a step-like bent shape that is L-shaped, and extending from the conductor LL5 as a third flat conductor. The terminal piece K50 corresponds to a third terminal piece. The third flat conductor is located on a third layer different from the first layer and the second layer, and is applied with a third potential different from the first potential and the second potential. The terminal piece K50 of the conductor terminal K5 includes a step portion 18 as a third step portion, and a contact portion 19 as a third contact portion. The step portion 18 is bent along a bending line E3 at substantially a right angle relative to the conductor LL5, and extends along an edge wall 11a to the first main surface 30a1 of the first busbar 30a. The bending line E3 extends along a third side that is one of the sides of the opening 11. The edge wall 11a constitutes the third side. In FIG. 7, the edge wall 11a serves as an edge wall of the edge portion of the first busbar 30a. The contact portion 19 is bent at substantially a right angle relative to the step portion 18, and extends along the first main surface 30a1 of the first busbar 30a. The contact portion 19 includes three hole portions 19a that face and come into contact with the three fastening points 22M3 of the output terminal M3 of the U-phase lower module 31c. The hole portions 19a correspond to a third hole portion. The three hole portions 19a, 19a, and 19a are located such that the line segment connecting the three hole portions 19a, 19a, and 19a extends parallel to the bending line E3 for the conductor LL5. The contact portion 19 has a rectangular plate-like shape, and has a greater length in a direction parallel to the bending line E3 than the length of the contact portion 19 in a direction perpendicular to the bending line E3.

FIG. 8 is a conceptual diagram illustrating a coupling state of the U-phase lower module 31c as a first semiconductor module and the first busbar 30a. In a state where the first main surface 30a1 of the first busbar 30a and a terminal location surface 21 of the U-phase lower module 31c are opposed to each other, the contact portion 15 of the conductor terminal K3 is aligned with the first input terminal M1 of the U-phase lower module 31c, while the contact portion 17 of the conductor terminal K6 is aligned with the second input terminal M2 of the U-phase lower module 31c. Then, the contact portion 15 of the conductor terminal K3 is fastened to the first input terminal M1 of the U-phase lower module 31c through the hole portion 15a illustrated in FIG. 7 by a conductive fastening member 40 such as a bolt, a screw, or a pin. Also, the contact portion 17 of the conductor terminal K6 is fastened to the second input terminal M2 of the U-phase lower module 31c through the hole portion 17a illustrated in FIG. 7 by the conductive fastening member 40.

Figure 9:
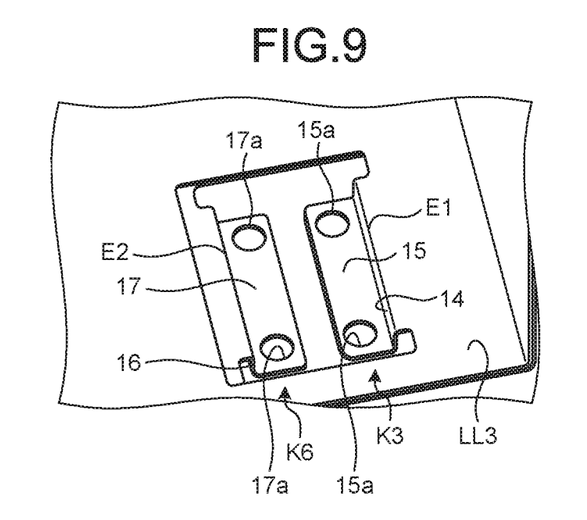
FIG. 9 is a perspective view illustrating the location of conductor terminals in the laminate busbar according to the embodiment.

FIG. 9 is a diagram illustrating a state where a laminate layer on the surface of the busbar 30 and an interior insulation layer are removed from the busbar 30 illustrated in FIG. 7. As illustrated in FIG. 9, an opposed step-like bent shape is employed for a pair of the conductor terminals K3 and K6 according to the present embodiment. The two hole portions 15a and 15a constitute a plurality of fastening points of the conductor terminal K3, and are provided side by side to be parallel to the bending line E1. Thus, the two hole portions 15a and 15a have an equal distance from the bending line E1. The same applies to the conductor terminal K6. That is, the two hole portions 17a and 17a constitute a plurality of fastening points of the conductor terminal K6, and are provided side by side to be parallel to the bending line E2. Thus, the two hole portions 17a and 17a have an equal distance from the bending line E2. Due to this structure, when an electric direct current supplied from the capacitors 71 and 72 flows through the conductor terminal K3, the current flow is prevented from becoming concentrated on one of the two hole portions 15a and 15a. The same applies to the conductor terminal K6. Therefore, the current sharing balance between the chips within the semiconductor module is improved, and accordingly an imbalance in heat generation within the semiconductor module can be reduced.

Figure 10:
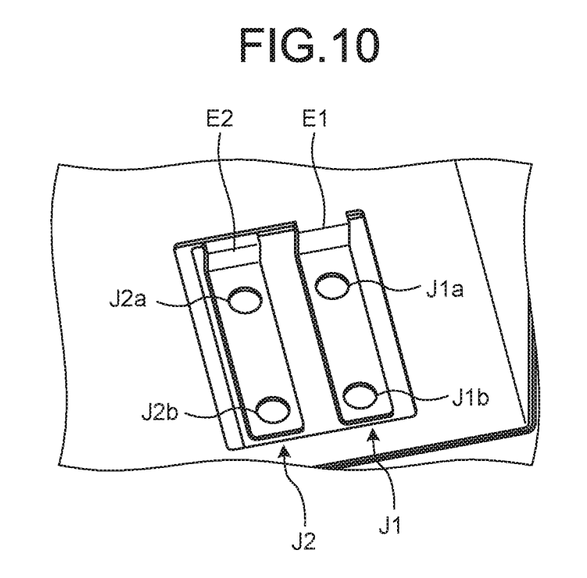
FIG. 10 is a perspective view illustrating the location of the conductor terminals in a comparative example.

FIG. 10 illustrates a comparative example of the location of conductor terminals. In this comparative example, two conductor terminals J1 and J2 extend from the same edge wall of the opening 10. Two hole portions J1a and J1b of the conductor terminal J1 are arrayed to be perpendicular to the bending line E1, and respectively have a different distance from the bending line E1. Two hole portions J2a and J2b of the conductor terminal J2 are arrayed to be perpendicular to the bending line E2, and respectively have a different distance from the bending line E2. Due to this structure in the comparative example, when an electric direct current supplied from the capacitors 71 and 72 flows through the conductor terminal J1, the current flow becomes concentrated on one of the two hole portions J1a and J1b, that is, the hole portion J1a. Therefore, in the comparative example, there is a possibility of an occurrence of a more significant imbalance in heat generation between the chips within the semiconductor module.

Figure 11:
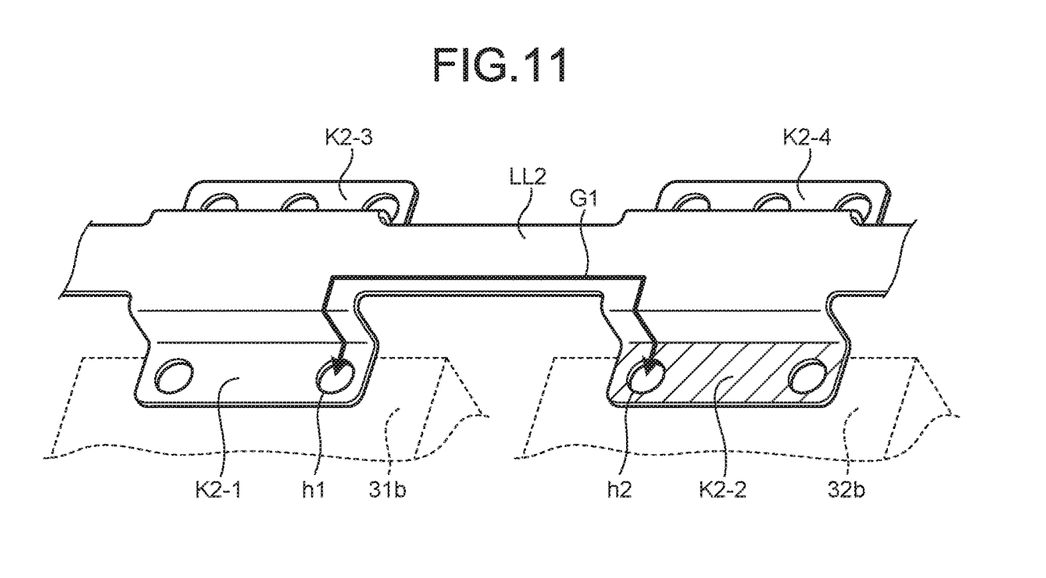
FIG. 11 is a perspective view illustrating the location of the conductor terminals in the laminate busbar according to the embodiment.

The conductor terminal structure with step bending according to the present embodiment can suppress an oscillating current that flows between the switching element in the first leg and the switching element in the second leg that are connected in parallel. For example, in the U-phase intermediate module 31b in the first leg and the U-phase intermediate module 32b in the second leg in the U-phase circuit 3 illustrated in FIG. 3, an oscillating current may flow through a path denoted by a reference sign G1, G2, G3, or G4. The U-phase intermediate module 31b corresponds to the first semiconductor module. The U-phase intermediate module 32b corresponds to a second semiconductor module. FIG. 11 illustrates the conductor LL2 constituting the wire L2 illustrated in FIG. 3, and four conductor terminals K2-1, K2-2, K2-3, and K2-4. The conductor terminal K2-1 is coupled with the first input terminal M1 of the U-phase intermediate module 31b in the U-phase first leg 31. The conductor terminal K2-2 is coupled with the first input terminal M1 of the U-phase intermediate module 32b in the U-phase second leg 32. A double-headed arrow G1 connecting a hole portion h1 and a hole portion h2 corresponds to a path G1 illustrated in FIG. 3. The hole portion h1 constitutes one of the coupling points of the conductor terminal K2-1. The hole portion h2 constitutes one of the coupling points of the conductor terminal K2-2. The path G1 can secure a greater length by the length of the step-like bent portion of the conductor terminals K2-1 and K2-2, as compared to the shortest distance directly connecting the hole portion h1 and the hole portion h2. In accordance with the location of the semiconductor modules illustrated in FIG. 6, the conductor terminal K2-3 is coupled with the output terminal M3 of the U-phase upper module 31a in the U-phase first leg 31, while the conductor terminal K2-4 is coupled with the output terminal M3 of the U-phase upper module 32a in the U-phase second leg 32.

Figure 12:
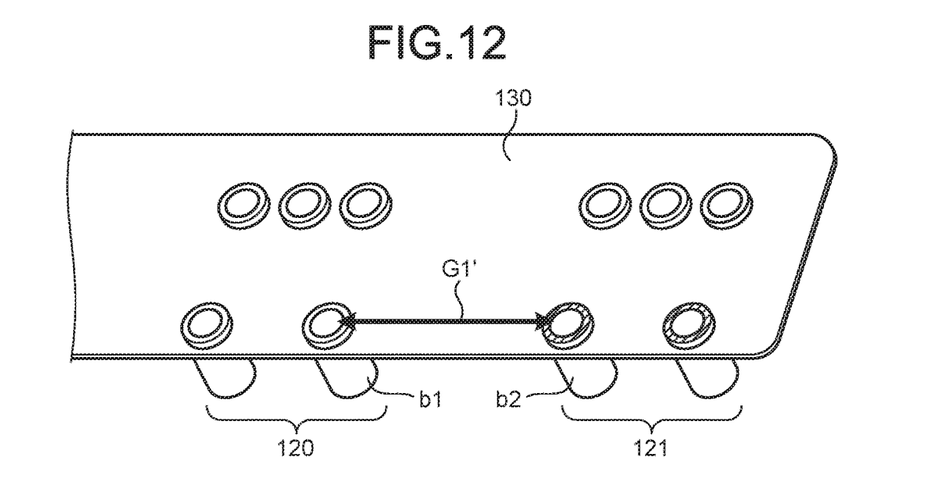
FIG. 12 is a perspective view illustrating the location of the conductor terminals in the comparative example.

FIG. 12 illustrates a comparative example of conductor terminals. Conductor terminals 120 and 121 in the comparative example have a cylindrical boss structure. The conductor terminals 120 correspond to the conductor terminal K2-1 illustrated in FIG. 11. The conductor terminals 121 correspond to the conductor terminal K2-2 illustrated in FIG. 11. In the comparative example, an oscillating current flows through a path denoted by G1'. The length of the path G1' corresponds to the length of the shortest distance directly connecting one of coupling points b1 of the conductor terminals 120 and one of coupling points b2 of the conductor terminals 121.

The terminal structure with step bending according to the present embodiment illustrated in FIG. 11 makes it possible to secure a longer distance between the conductor terminal of the first leg and the conductor terminal of the second leg as compared to the terminal structure with the boss structure illustrated in FIG. 12. Due to this structure, it is possible to suppress an oscillating current that flows between the switching element of the first leg and the switching element of the second leg as compared to the structure in the comparative example. The conductor terminal structure according to the present embodiment illustrated in FIG. 11 has a function equivalent to increasing the distance of the conductors between the coupling point b1 and the coupling point b2 by forming a slit (not illustrated) between the coupling point b1 and the coupling point b2 on a flat conductor 130 in FIG. 12.

Figure 13:
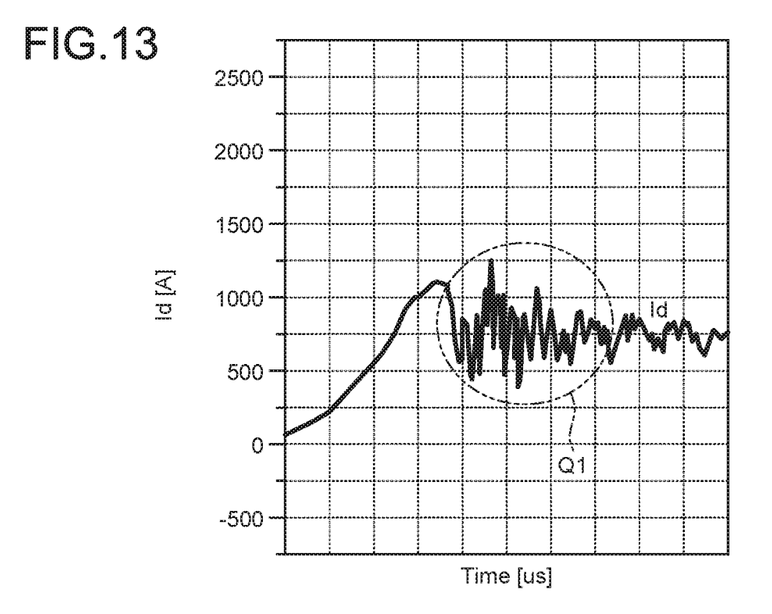
FIG. 13 is a diagram illustrating a current that flows through a switching element in a case of employing a terminal structure according to the comparative example.

FIG. 13 illustrates a current that flows through a switching element in a case of employing the terminal structure according to the comparative example illustrated in FIG. 12. FIG. 13 illustrates, for example, a current Id that flows through the switching element 31bs1 included in the U-phase intermediate module 31b of the U-phase first leg 31 when the switching element 31bs1 is turned on. In the case of employing the terminal structure in the comparative example, a greater oscillation waveform with a higher frequency is generated as illustrated by Q1.

Figure 14:
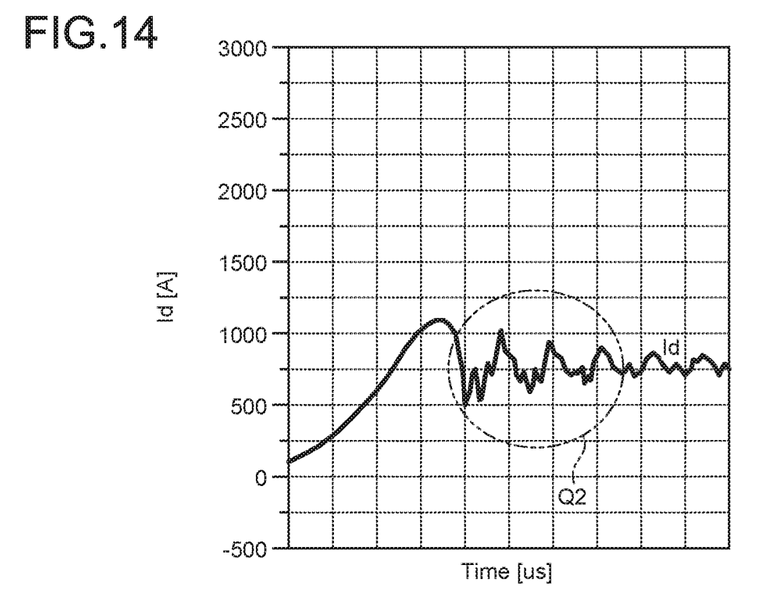
FIG. 14 is a diagram illustrating a current that flows through a switching element in a case of employing a terminal structure according to the embodiment.

FIG. 14 illustrates a current that flows through a switching element in a case of employing the terminal structure with step bending according to the present embodiment. FIG. 14 illustrates, for example, a current Id that flows through the switching element 31bs1 included in the U-phase intermediate module 31b of the U-phase first leg 31 when the switching element 31bs1 is turned on. In the case of employing the terminal structure according to the present embodiment, an oscillating current is suppressed as illustrated by Q2, compared to the comparative example.

The terminal structure with step bending according to the present embodiment can secure a greater current-carrying area of a terminal, and decrease the amount of heat generated in the terminal portion, and also makes it possible to pass a greater amount of current, as compared to the boss-structure conductor terminal illustrated in FIG. 12. The hatching of the conductor terminal K2-2 in FIG. 11 illustrates the current-carrying area of the conductor terminal K2-2. The hatching of the conductor terminal 121 in FIG. 12 illustrates the current-carrying area of the conductor terminal 121.

As described above, the busbar according to the present embodiment employs opposed-location step bending for the structure of a conductor terminal fastened to a semiconductor module, such that a plurality of hole portions constituting a plurality of fastening points of the conductor terminal are located to be parallel to the step bending line. Due to this structure, a current that flows through the fastening points is equalized, and this improves the current sharing balance between chips within a semiconductor module, and accordingly can reduce an imbalance in heat generation within the semiconductor module.

The conductor terminal structure with step bending according to the present embodiment may also be applied to a semiconductor module in the converter circuit 80.

The configurations described in the above embodiments are only examples of the content of the present invention. The configurations can be combined with other well-known techniques, and part of each of the configurations can be omitted or modified without departing from the scope of the present invention.

REFERENCE SIGNS LIST 10 opening, 11 opening, 14, 16, 18 step portion, 15, 17, 19 contact portion, 15a, 17a, 19a hole portion, 20 package, 30 laminate busbar, 40 fastening member, 60 inverter circuit, 70 direct-current voltage circuit, 71, 72 capacitor, 75 conductor bar, 76 output core, 80 converter circuit, 85 motor, 90 power conversion device, 100 railway vehicle, K1 to K6 conductor terminal, LL1 to LL6 flat conductor.

The invention claimed is:

1. A main circuit wiring member including a first main surface on which a first semiconductor module is mounted, a second main surface that is a surface opposite to the first main surface, and a plurality of flat conductors layered through insulators, the main circuit wiring member comprising:
a first flat conductor located on a first layer and applied with a first potential;
a second flat conductor located on a second layer and applied with a second potential;
a first opening passing through between the first main surface and the second main surface;
a first terminal including a first terminal piece with a step-like bent shape, in which the first terminal piece is bent from the first flat conductor along a first side that is one of sides of the first opening, and a plurality of first hole portions formed on the first terminal piece and arrayed in a direction parallel to the first side; and
a second terminal including a second terminal piece with a step-like bent shape, in which the second terminal piece is bent from the second flat conductor along a second side that is one of sides of the first opening and opposed to the first side, and a plurality of second hole portions formed on the second terminal piece and arrayed in a direction parallel to the second side, wherein
the first terminal is fastened to a first module terminal of the first semiconductor module through the first hole portions, and the second terminal is fastened to a second module terminal of the first semiconductor module through the second hole portions.

2. The main circuit wiring member according to claim 1, wherein
the first terminal piece includes a first step portion bent relative to the first flat conductor along the first side, and a first contact portion bent relative to the first step portion and extending parallel to the first main surface, and the first hole portions are formed on the first contact portion, and
the second terminal piece includes a second step portion bent relative to the second flat conductor along the second side, and a second contact portion bent relative to the second step portion and extending parallel to the first main surface, and the second hole portions are formed on the second contact portion.

3. The main circuit wiring member according to claim 2, wherein
the first step portion extends to the first main surface along a first edge wall that constitutes the first side of the first opening, and
the second step portion extends to the first main surface along a second edge wall that constitutes the second side of the first opening.

4. The main circuit wiring member according to claim 2, wherein a spacing between the first contact portion and the second contact portion is equal to or greater than a length corresponding to a determined spatial insulation distance.

5. The main circuit wiring member according to claim 2, wherein the first contact portion is fastened to a first module terminal of the first semiconductor module through the first hole portions by a first fastening member, and the second contact portion is fastened to a second module terminal of the first semiconductor module through the second hole portions by a second fastening member.

6. The main circuit wiring member according to claim 2, wherein
the first contact portion has a rectangular plate-like shape, and a length of the first contact portion in a direction parallel to the first side is greater than a length of the first contact portion in a direction perpendicular to the first side, and
the second contact portion has a rectangular plate-like shape, and a length of the second contact portion in a direction parallel to the second side is greater than a length of the second contact portion in a direction perpendicular to the second side.

7. The main circuit wiring member according to claim 1, wherein
the first semiconductor module further includes a plurality of third module terminals,
the main circuit wiring member comprises:
a third flat conductor located on a third layer and applied with a third potential;
a second opening passing through between the first main surface and the second main surface; and
a third terminal including a third terminal piece with a step-like bent shape, in which the third terminal piece is bent from the third flat conductor along a third side that is one of sides of the second opening, and a plurality of third hole portions formed on the third terminal piece and arrayed in a direction parallel to the third side, and
the third terminal is fastened to a third module terminal of the first semiconductor module through the third hole portions.

8. The main circuit wiring member according to claim 7, wherein the third terminal piece includes a third step portion bent relative to the third flat conductor along the third side, and a third contact portion bent relative to the third step portion and extending parallel to the first main surface, and the third hole portions are formed on the third contact portion.

9. The main circuit wiring member according to claim 1, wherein
the first main surface has a second semiconductor module mounted thereon, and the first semiconductor module and the second semiconductor module respectively constitute a first leg and a second leg connected in parallel,
the main circuit wiring member comprises:
a third opening provided beside the first opening, and passing through between the first main surface and the second main surface;
a fourth terminal including a fourth terminal piece with a step-like bent shape, in which the fourth terminal piece is bent from the first flat conductor along a fourth side that is one of sides of the third opening, and a plurality of fourth hole portions formed on the fourth terminal piece and arrayed in a direction parallel to the fourth side; and
a fifth terminal including a fifth terminal piece with a step-like bent shape, in which the fifth terminal piece is bent from the second flat conductor along a fifth side that is one of sides of the third opening and opposed to the fourth side, and a plurality of fifth hole portions formed on the fifth terminal piece and arrayed in a direction parallel to the fifth side, and
the fourth terminal is fastened to a fourth module terminal of the second semiconductor module through the fourth hole portions, and the fifth terminal is fastened to a fifth module terminal of the second semiconductor module through the fifth hole portions.

10. A power conversion device comprising the main circuit wiring member according to claim 1, the first semiconductor module, and a capacitor mounted on the main circuit wiring member.

* * * * *